US008254195B2

(12) United States Patent
Rao

(10) Patent No.: US 8,254,195 B2
(45) Date of Patent: Aug. 28, 2012

(54) HIGH-SPEED SENSING FOR RESISTIVE MEMORIES

(75) Inventor: Hari M. Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 53 days.

(21) Appl. No.: 12/791,284

(22) Filed: Jun. 1, 2010

(65) Prior Publication Data
US 2011/0291761 A1 Dec. 1, 2011

(51) Int. Cl.
G11C 7/02 (2006.01)
G11C 7/00 (2006.01)
G11C 11/00 (2006.01)
G11C 11/14 (2006.01)

(52) U.S. Cl. ... 365/209; 365/157; 365/171; 365/189.15; 365/208

(58) Field of Classification Search .................... 365/209
See application file for complete search history.

(56) References Cited

U.S. PATENT DOCUMENTS

| | | | |
|---|---|---|---|
| 4,763,026 A | 8/1988 | Tsen et al. | |
| 4,918,341 A * | 4/1990 | Galbraith et al. | 327/51 |
| 5,006,817 A | 4/1991 | Babanezhad | |
| 5,825,212 A | 10/1998 | Priebe | |
| 6,191,989 B1 * | 2/2001 | Luk et al. | 365/207 |
| 6,466,488 B2 * | 10/2002 | Sowards et al. | 365/189.07 |
| 6,512,688 B2 * | 1/2003 | Thewes et al. | 365/158 |
| 6,608,787 B1 * | 8/2003 | Daga et al. | 365/203 |
| 6,611,468 B2 * | 8/2003 | Nojiri et al. | 365/207 |
| 6,717,474 B2 * | 4/2004 | Chen et al. | 330/301 |
| 6,885,579 B2 * | 4/2005 | Sakimura et al. | 365/158 |
| 7,038,959 B2 * | 5/2006 | Garni | 365/203 |
| 7,130,235 B2 | 10/2006 | Perner | |
| 7,242,174 B1 * | 7/2007 | Sheu et al. | 324/76.11 |
| 7,254,052 B2 * | 8/2007 | Liaw | 365/148 |
| 7,283,407 B2 * | 10/2007 | Inoue et al. | 365/189.11 |
| 7,292,471 B2 * | 11/2007 | Sakimura et al. | 365/173 |
| 7,313,042 B2 * | 12/2007 | Hidaka | 365/209 |
| 7,642,815 B2 * | 1/2010 | Fort | 327/51 |
| 7,813,166 B2 * | 10/2010 | Jung et al. | 365/158 |
| 2004/0004856 A1 * | 1/2004 | Sakimura et al. | 365/158 |
| 2004/0136256 A1 | 7/2004 | Dadashev | |

FOREIGN PATENT DOCUMENTS

EP 1460637 A1 9/2004

OTHER PUBLICATIONS

International Search Report and Written Opinion—PCT/US2011/038599, ISA/EPO—Sep. 13, 2011.

* cited by examiner

Primary Examiner — Son Mai
(74) Attorney, Agent, or Firm — Sam Talpalatsky; Nicholas J. Pauley; Jonathan T. Velasco

(57) ABSTRACT

Embodiments of the present disclosure use one or more gain stages to generate an output voltage representing whether a resistive memory element of a data cell stores a high data value or a low data value. In a particular embodiment, an apparatus includes a sensing circuit. The sensing circuit includes a first amplifier stage that is configured to convert a first current through a first resistive memory element of a memory cell into a first single-ended output voltage. A second amplifier stage is configured to amplify the first single-ended output voltage of the first amplifier stage to produce a second single-ended output voltage.

43 Claims, 8 Drawing Sheets

HIGH-SPEED SENSING FOR RESISTIVE MEMORIES

I. FIELD

The present disclosure is generally related to sensing data values stored in cells of resistive memory devices.

II. DESCRIPTION OF RELATED ART

The time required for a computing system to perform an operation is often a function of the speed of the computing system's processor and the speed of the computing system's memory system. To keep pace with increasingly faster processors, it is desirable to increase the speed at which instructions and data may be retrieved from memory.

In a cell of a resistive memory device, such as a magneto-resistive random access memory (MRAM) cell or a spin torque transfer MRAM (STT MRAM) cell, reading a data value stored in a resistive memory element of the cell involves passing a "data current" through the resistive memory element. The data current is compared to a "reference current" that represents an average of currents passing through a reference resistive memory element set to a high data value and a reference resistive memory element set to a low data value. Comparing the data current to the reference current indicates whether the resistive memory element stores a high data value or a low data value. Reading the stored data value involves using a sense amplifier to compare the data current and the reference current and to generate an output voltage that indicates whether the stored data value is a high data value or a low data value.

In such a system, time is allotted for the sense amplifier to respond to the data current and the reference current by generating an output voltage that reaches a threshold indicative of the stored data value. As memory devices are increasingly miniaturized (and thus may be increasingly prone to process variations in the production of the memory devices) the thresholds signifying the difference between the stored data value being a high data value and the stored data value being a low data value may be increased to accommodate increased noise and process variation. A higher threshold leads to greater time for the sense amplifier to generate a data output, resulting in a longer time to read data values and reduced processing throughput of a computing system.

III. SUMMARY

Embodiments of the present disclosure use one or more gain stages to generate an output voltage representing whether a resistive memory element of a data cell stores a high data value or a low data value. In response to receiving a first single-ended output voltage representative of the data current passing through a resistive memory element, a gain stage amplifies the first single-ended output voltage toward a supply voltage (for a data current representing a high data value) or toward ground (for a data current representing a low data value). The gain stage responds quickly to the data current to generate a second single-ended output voltage that diverges quickly and sharply in response to the data current.

In a particular embodiment, an apparatus includes a sensing circuit. The sensing circuit includes a first amplifier stage that is configured to convert a first current through a first resistive memory element of a memory cell into a first single-ended output voltage. The sensing circuit includes a second amplifier stage that is configured to amplify the first single-ended output voltage of the first amplifier stage to produce a second single-ended output voltage.

In another particular embodiment, a sensing circuit includes first amplifier means for generating a first single-ended output voltage based on a first current passing through a resistive memory cell. The sensing circuit also includes a second amplifier means for amplifying the first single-ended output voltage to produce a second single-ended output voltage. The second single-ended output voltage represents a data output of the resistive memory cell.

In another particular embodiment, a method includes amplifying a first single-ended output voltage corresponding to a current through a resistive memory element that represents a stored data value. The first single-ended output voltage is amplified to produce a second single-ended output voltage. The second single-ended output voltage indicates the stored data value.

One particular advantage provided by at least one of the disclosed embodiments is to reduce the time for a sense amplifier to sense that a voltage representing a stored data value has diverged from a reference voltage to identify the stored data value. The gain stage or amplifier that amplifies the first single-ended voltage output representing the current level flowing through the resistive memory element quickly drives a second single-ended output voltage between rails, i.e., to a level of a supply voltage or of ground, to quickly provide an output to identify the stored data value. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
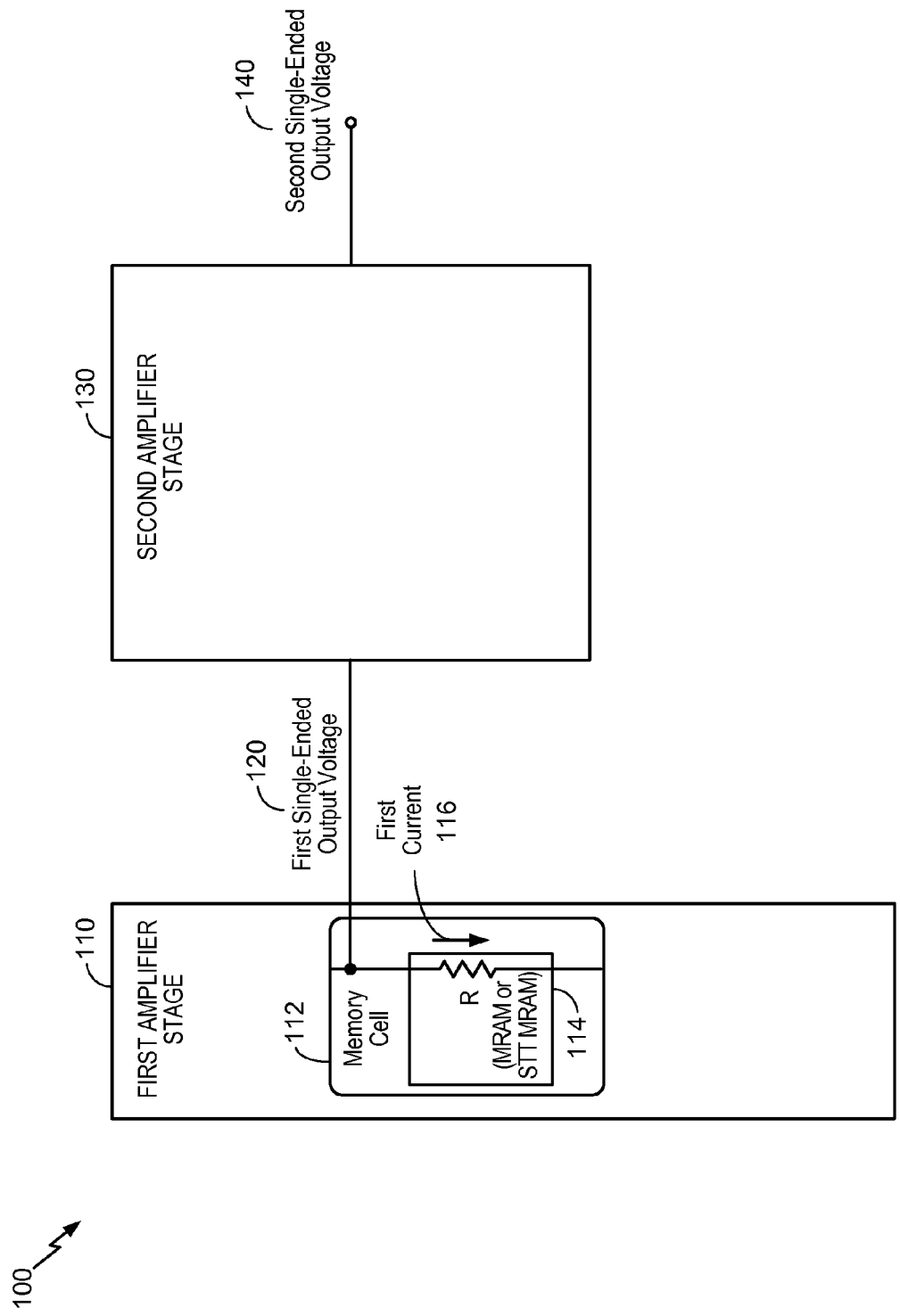
FIG. 1 is a diagram of a particular illustrative embodiment of a system including a sensing circuit having a second amplifier stage configured to amplify a first single-ended output voltage representing a data value stored in a resistive memory cell and to generate an output voltage indicative of the stored data value.

Referring to FIG. 1, a first illustrative embodiment of a sensing circuit is depicted and generally designated 100. The sensing circuit 100 includes a first amplifier stage 110 coupled to a second amplifier stage 130. The first amplifier stage 110 is configured to convert a current 116 through a first resistive memory element 114 of a memory cell 112 into a first "single-ended" output voltage 120. A signal may be termed single-ended when the signal is compared to a fixed voltage, such as a ground voltage, as compared to a differential signal that includes two signals that are compared with each other. The second amplifier stage 130 is configured to amplify the first single-ended output voltage 120 of the first amplifier stage 110 to produce a second single-ended output voltage 140. The second single-ended output voltage 140 indicates a data value of the first resistive memory element 114. In response to the first resistive memory element 114 having a first resistance, the second single-ended output voltage 140 is substantially equal to a ground voltage. On the other hand, in response to the first resistive memory element 114 having a second resistance, the second single-ended output voltage 140 is substantially equal to a supply voltage of the second amplifier stage 130.

The second amplifier stage 130 is configured to amplify the first single-ended output voltage 120, rather than amplifying a differential signal to generate an output. In other words, the second amplifier stage 130 is configured to perform single-ended output voltage amplification, not without differential amplification. Without waiting for respective input voltages to settle and waiting for divergence of the output voltage from a reference voltage as performed in a differential amplifier, a change in the current 116 quickly results in a change in the first single-ended output voltage 120. The change in the current 116 and the in the single-ended output voltage 120 in turn results in an immediate or substantially immediate change in the second single-ended output voltage 140. Thus, the second amplifier stage 130 may enable generation of the second single-ended output voltage 140 without a delay associated with differential sense amplifiers or other differential voltage comparisons.

In a particular embodiment, the memory cell 112 is a memory cell of a resistance-based memory. For example, the memory cell 112 may be part of a magneto-resistive random access memory (MRAM). As another example, the memory cell 112 may be part of a spin torque transfer MRAM (STT-MRAM) device. In a particular embodiment, the resistive memory element 114 may include a magnetic tunnel junction (MTJ) device or a perpendicular MTJ device. For example, the MTJ device may be programmed to have a first resistance representing a first data value or a second resistance representing a second data value. As a result, a value of the current 116 may correspond to the data value stored at the resistive memory element 114. The first amplifier stage 110 is configured to generate the first single-ended output voltage 120 in response to a value of the current 116. The first single-ended output voltage 120 will have a higher value when the resistive memory element 114 of the memory cell 112 has a high resistance value and thus provides greater resistance to a high voltage drop across the resistive memory element 114 as compared to a lower value of the first single-ended output voltage 120 that results when the resistive memory element 114 of the memory cell 112 has a low resistance value that enables a greater voltage drop across the resistive memory element 114. As a result, the first single-ended output voltage 120 has a voltage level that is representative of a data value stored at the resistive memory element 114 of the memory cell 112.

The second amplifier stage 130 generates the second single-ended output voltage 140 by amplifying the first single-ended output voltage 120 without performing a differential amplification operation. For example, the second amplifier stage 130 may be configured to amplify the first single-ended output voltage 120 as a rail-to-rail output signal. As a result, when a first value of the first single-ended output voltage 120 corresponds to a first data value of the memory cell 112, the second amplifier stage 130 generates the second single-ended output voltage 140 at a voltage approximating a supply voltage supplied to the second amplifier stage 130. Conversely, when a second value of the first single-ended output voltage 120 corresponds to a second data value of the memory cell 112, the second amplifier stage 130 generates the second single-ended output voltage 140 at a voltage approximating a ground voltage.

The second amplifier stage 130 generates the second single-ended output voltage 140 in response to the first single-ended output voltage 120. Therefore, the second amplifier stage 130 may enable faster amplification in generating an output than may be achieved by systems where an output voltage is generated based on differential amplification. Differential amplification systems may impose a delay in generating an output signal to allow sufficient time to establish a differential between the input voltage levels. Imposing a delay reduces spurious output signals that may result before the differential between the voltage levels stabilizes. By contrast, because the second amplifier stage 130 is configured to amplify the first single-ended output voltage 120, no delay is imposed to establish a differential output. The second single-ended output voltage 140 may be generated immediately or substantially immediately after the current 116 is applied to the resistive memory element 114 of the memory cell 112. The second amplifier stage 130 thus may provide a faster response than an amplifier stage that includes a differential sense amplifier or that otherwise compares an output of an amplifier stage to a reference voltage.

In addition to fast response time, the second amplifier stage 130 may also enable reading a stored data value when a differential amplifier may not be able to read the stored data value. For example, when the resistive memory element 114 of the memory cell 112 is a MTJ that stores a data value, a tunnel magnetoresistance (TMR) of the MTJ is a function of a ratio of a difference between resistances of the resistive memory element 114 in anti-parallel ($R_{AP}$) and parallel ($R_P$) configurations to $R_P$, as given by Eq. (1):

$$\text{TMR} = (R_{AP} - R_P)/R_P \qquad (1)$$

The TMR for any given magnetoresistive memory element may be a fixed quantity. Thus, there generally is a fixed differential between a voltage output when a current passes through the magnetoresistive memory element in its anti-parallel and parallel configurations. If a differential amplifier is used to read the stored data value, because of process scaling there is a possibility the differential amplifier may have an intrinsic voltage offset that is greater than the resulting voltage differential resulting from reading the stored value in the magnetoresistive memory element. In such a case, the differential amplifier may be unable to accurately read the value stored in the magnetoresistive memory element.

By contrast, the second amplifier stage 130 is responsive to any change in the first single-ended output voltage 120, even if the shift from an equilibrium value in the first single-ended output voltage 120 (as described further with reference to FIG. 4) does not transcend a range that may fall within a voltage offset of a differential amplifier. For example, if a first value of the first single-ended output voltage 120 corresponds to a first data value stored at the resistive memory element 114 and a second value of the first single-ended output voltage 120 corresponds to a second data value stored at the resistive memory element 114, a change in the first current 116 may initiate an immediate change from the equilibrium point of the first single-ended output voltage 120 even when a differential between the first and second values is less than a differential amplification voltage offset. The second amplifier stage 130 can replace a conventional differential amplifier and may eliminate such an offset/differential problem relating from the use of a differential amplifier.

Reduced power operation of a resistance-based memory may involve reducing a write energy that is used to write data values to the resistive memory elements. As a result, read operations may be performed with a reduced supply voltage to reduce a risk of the read current disturbing the stored data. However, lowering a read voltage may result in a reduced differential between values in the first single-ended output voltage 120 that may not be sufficient to cause the second amplifier stage 130 to drive the second single-ended output voltage 140 rail-to-rail between a ground voltage and a supply voltage of the second amplifier stage 130. However, as further described with reference to FIG. 5, amplifier stages may be cascaded to result in a rail-to-rail or more highly-differentiated output voltage. For example, the second single-ended output voltage 140 of the second amplifier stage 130 may be an input to a third amplifier stage (not shown in FIG. 1). Although the second single-ended output voltage 140 may not output rail-to-rail output values, the second single-ended output voltage 140 may have a greater differentiation than the first single ended-output voltage 120 and, thus, may be sufficient to drive a third amplifier stage to generate a third single-ended output voltage (also not shown in FIG. 1) from rail-to-rail. Each amplifier stage may add only a gate delay, which is a significantly shorter delay than a conventional differential amplifier delay. Thus, multiple gain stages may be cascaded to provide a rail-to-rail voltage output at greater speed than may be achieved using a differential amplifier stage.

As a result, the sensing circuit 100 may enable operation with an improved speed as compared to conventional sense amplifiers. In addition, the sensing circuit 100 avoids challenges presented by increased voltage offsets of conventional differential amplifiers that result from process scaling. Further, the sensing circuit 100 enables read operations at a reduced supply voltage, such as at a 1.2 volt supply voltage using a cascaded gain stage as an illustrative example, to provide rail-to-rail amplification for reading cells without disturbing stored data values in systems designed to operate using reduced write energy for lower power operation.

Figure 2:
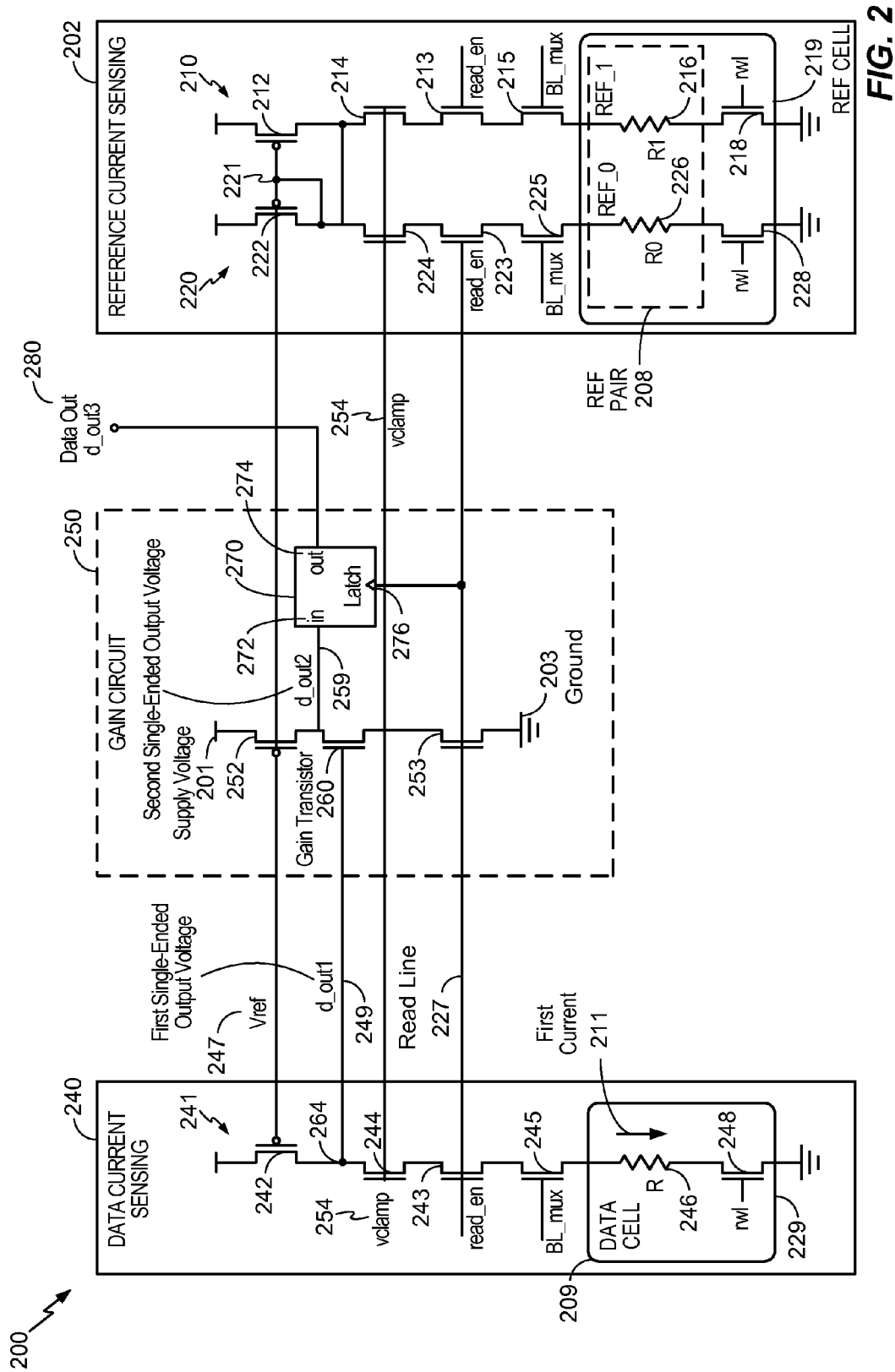
FIG. 2 is a diagram of a particular illustrative embodiment of a system having a gain circuit to generate an output voltage in response to receiving a first single-ended output voltage representing a data value stored in a resistive memory cell.

Referring to FIG. 2, a second illustrative embodiment of a sensing circuit is depicted and generally designated 200. The sensing circuit 200 includes a gain circuit 250 coupled to a reference current sensing circuit 202 and coupled to a data current sensing circuit 240. The reference current sensing circuit 202 includes a reference cell 219 that includes a reference pair 208 including resistive memory elements 216 and 226. The reference current sensing circuit 202 also includes a first reference path 210 and a second reference path 220. The first reference path 210 includes a load device, such as a p-channel metal oxide semiconductor (PMOS) field effect transistor (P-FET) load 212. The P-FET load 212 is coupled to a first reference node 221, which in turn is coupled to a clamp transistor 214. A read enable transistor 213 is coupled to the clamp transistor 214. A bit line multiplexer (mux) transistor 215 is coupled to the read enable transistor 213. A gate of the read enable transistor 213 is coupled to a read line 227. The resistive element 216 has a resistance R1 corresponding to a logic "one" state of a resistance based memory element coupled to the bit line mux transistor 215. An access transistor 218 is coupled to the resistive element 216 and is controlled by a common signal Vrwl that represents a common gate voltage to the access transistors 218, 228, and 248. The second reference path 220 includes a load device, such as a P-FET load 222. The P-FET load 222 is coupled to the first reference node 221, which in turn is coupled to a clamp transistor 224. A read enable transistor 223 is coupled to the clamp transistor 224. A bit line mux transistor 225 is coupled to the read enable transistor 223. A gate of the read enable transistor 223 is coupled to the read line 227. The resistive element 226 has a resistance R0 corresponding to a logic "zero" state of a resistance based memory element is coupled to the bit line mux transistor 225. An access transistor 228 is coupled to the resistive element 226 and is also controlled by the common signal Vrwl.

The data current sensing circuit 240 includes a single data path 241. The data path 241 includes a load device, such as a P-FET load 242. The P-FET load 242 is coupled to a second reference node 264, which in turn is coupled to a clamp transistor 244. A read enable transistor 243 is coupled to the clamp transistor 244. A bit line mux transistor 245 is coupled to the read enable transistor 243. The resistance-based memory element 246 has a resistance R corresponding to a logic state of a resistance based memory element and is coupled to the bit line mux transistor 245. An access transistor 248 is coupled to the resistance-based memory element 246 and is controlled by the common signal Vrwl. A data cell 229 includes the resistance-based memory element 246 and the access transistor 248 of the data path 241. A voltage at the second reference node 264 is the first single-ended output voltage 249, which is responsive to a first current 211 flowing through the resistance-based memory element 246 that represents the stored data value of the data cell 229.

The gain circuit 250, similar to paths 210 and 220 of the reference current sensing circuit 202 and the data path 241 of the data current sensing circuit 240, includes a P-FET load 252 and a read enable transistor 253. A gain device 260 is illustrated as a first NMOS transistor 260 with a drain coupled to a source of the P-FET load 252, a source coupled to a drain of the read enable transistor 253, and a gate coupled to the second reference node 264. The gain device 260 is responsive to the first single-ended output voltage 249. The P-FET load 252, in one embodiment, has a gate responsive to a reference voltage, a drain coupled to the voltage supply 201, and a source coupled to a drain of the first NMOS transistor 260. A gate of the read enable transistor 253 is coupled to the read line 227 to selectively couple the source of the first NMOS transistor 260 to ground. The second single-ended output voltage 259 is read at the drain of the NMOS gain transistor 260 when the read line 227 is enabled.

The gain circuit 250 also includes a latch 270 having an input 272 that receives the second single-ended output voltage 259. The latch 270 also has an output 274 from which latched data d_out3 280 may be read. The latch 270 includes a clock input 276. The clock input 276 of the latch 270, like the read enable transistors read_en 213 and 223 of the reference current sensing circuit 202 and the read enable transistor read_en 243 of the data current sensing circuit 240, is coupled to the read line 227. The latch 270 is clocked to store the second single-ended output voltage 259 when the read enable signal is active.

Generally, corresponding components of each of the paths 210, 220, 240 may have similar configurations and may operate in a substantially similar manner. Each of the clamp transistors 214, 224, and 244 functions to limit current and voltage through the respective paths 210, 220, and 241 based on a signal Vclamp 254. The signal Vclamp 254 represents a common gate voltage that enables the clamp transistors 214, 224, and 244 to function as clamping transistors. Each of the access transistors 218, 228, and 248 selectively allows current flow through the respective paths 210, 220, and 241 based on the common signal Vrwl that represents a common gate voltage to the access transistors 218, 228, and 248.

A gate of each of the P-FET load devices 212, 222, and 242 is coupled to the first reference node 221. Thus, a gate voltage of each of the P-FET load devices 212, 222, and 242 is a reference voltage Vref 247. Because an operating current of the reference current sensing circuit 202 is an average current of a reference pair 208 that includes resistive elements 216 and 226, Vref 247 delineates between a voltage passing through a path that includes a resistive memory element storing a high data value and a path that includes a resistive memory element storing a low data value.

A first single-ended output voltage 249 generated by the data current sensing circuit 240 indicates whether a resistive memory element 246 in the data cell 209 represents a high logical value or a low logical value. A second single-ended output voltage 259 provides an amplified output signal in response to the first single-ended output voltage 249. The second single-ended output voltage 259 is driven "rail-to-rail" between a supply voltage 201 of the gain circuit 250 and a ground 203 to provide a clearly differentiated voltage representing a stored data value.

The first NMOS transistor 260 thus acts as an amplifier of the first single-ended output voltage 249, where an output d_out2 259 at the drain of the first NMOS transistor 260 is a second single-ended output voltage (i.e., d_out2 259 is not part of a differential voltage pair). The read enable transistor 253 has a gate responsive to the read line 227 to couple the source of the first NMOS transistor 260 to ground. Depending on the first single-ended output voltage d_out1 249, the second single-ended output voltage d_out2 259 will be driven toward the supply voltage 201 or the ground 203. The second single-ended output voltage 259 is read at the drain of the NMOS gain transistor 260 when the read line 227 is enabled. The gain circuit 250 may amplify the first single-ended output voltage 249 at a speed at which a single NMOS device responds to an input at a gate of the NMOS device. The response of the gain circuit 250, thus, can be much faster than a response of a sense amplifier performing a comparison of voltage signals as may be performed in a conventional sensing circuit.

Figure 3:
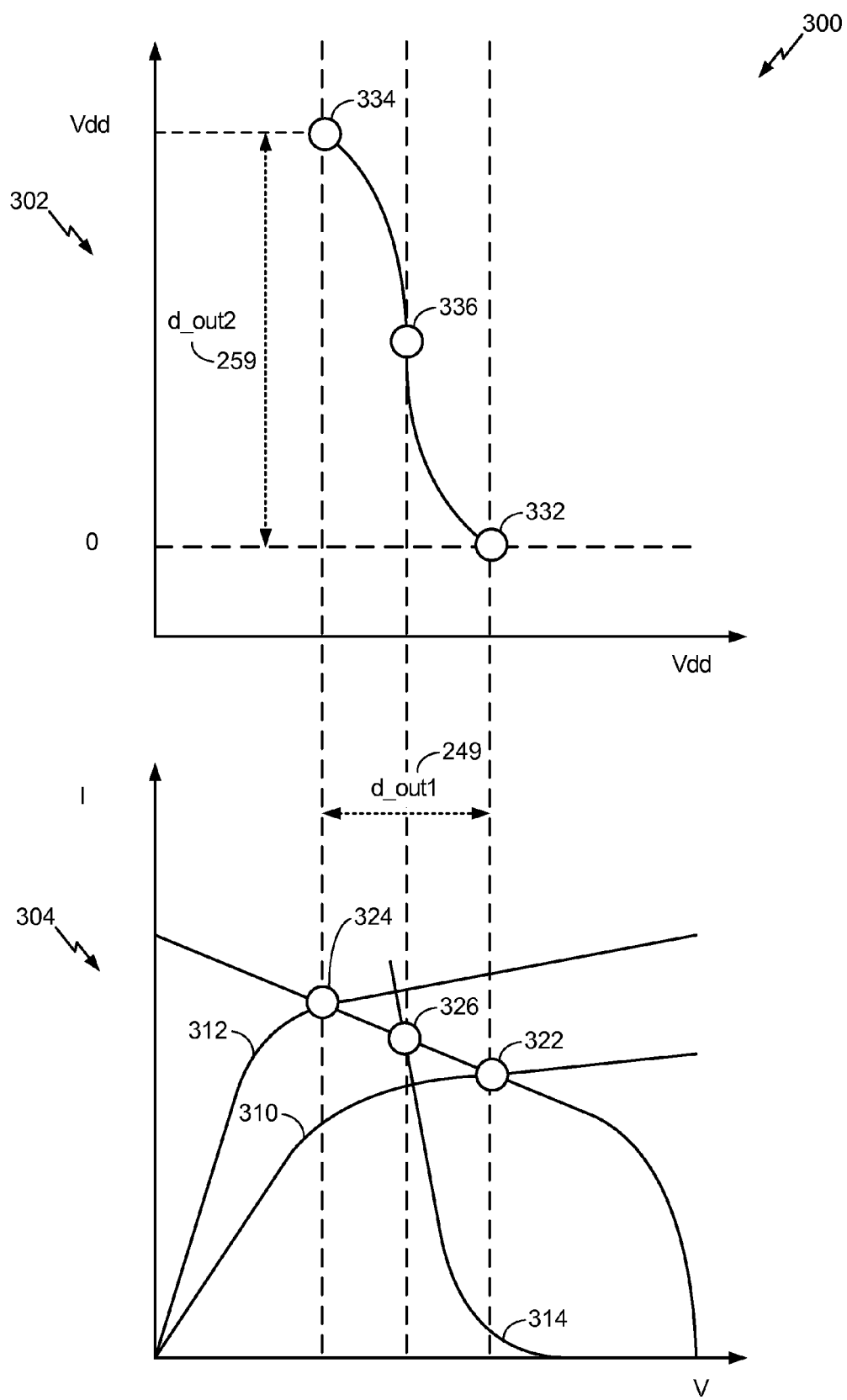
FIG. 3 is a pair of graphs of a particular embodiment of circuit characteristics of elements of the system of FIG. 2.

Referring to FIG. 3, a particular illustrative embodiment of circuit characteristics of the system depicted in FIG. 2 is illustrated and generally designated 300. The circuit characteristics 300 are illustrated as including a transfer curve 302 of the gain circuit 250 and also including a load-line diagram 304 of load-line characteristics corresponding to the data current sensing circuit 240 and the reference current sensing circuit 202.

The load-line diagram 304 includes a first trace 310 corresponding to a current-voltage characteristic of the data cell 209 of FIG. 2 when the resistive memory element 246 has a first data value and a second trace 312 that illustrates a second current-voltage characteristic of the data cell 209 when the resistance based memory element 246 has a second data value. A trace 314 illustrates a load characteristic of the reference current sensing circuit 202 having diode-like behavior due to the biasing of the P-FET load 222 because the drain of the P-FET load 222 is coupled to the node 221. A trace 314 illustrates a load-line current-voltage characteristic of the load transistor 242 of the data current sensing circuit 240, which is biased by the voltage at the node 221 as generated by the reference current sensing circuit 202. An intersection of the diode-like trace 314 and the trace of the current-voltage characteristic of the P-FET 242 of the data current sensing circuit 240 indicates a reference point 326. An output voltage greater than the voltage of the reference point 326 may be interpreted as a data low value stored at the data cell 209, while an output voltage level less than the voltage of the reference point 326 may be interpreted as a data high value at the data cell 209. The load-line diagram 304 indicates two operating point 322, 324 as stable points where current through the data cell 209, indicated by the traces 310 and 312, is equal to current through the P-FET load 242, as indicated by the load trace 314. The operating point 322 represents a low data value stored in the data cell 209, and the operating point 324 represents a high data value stored in the data cell 209. A voltage differential between the data low operating point 322 and the data high operating point 324 is illustrated as d_out1 249, which corresponds to the first single-ended output voltage.

The first single-ended output voltage d_out1 249 is provided as an input voltage to a second stage amplifier, illustrated as the gain circuit 250 in FIG. 2. The transfer curve 302 indicates that at the reference voltage 326, separating the d_out1 249 voltage range between the data high value and the data low value, the second amplifier stage (e.g. the gain circuit 250) has an equilibrium point 336. The equilibrium point 336 is approximately halfway between a high and a low voltage level of the second single-ended output voltage d_out2 259, which ranges from substantially ground (e.g., 0 volts) to a supply voltage (e.g., Vdd). Similarly, the transfer curve 302 of the gain circuit 250 indicates that at the data low operating point 322, d_out2 259 is at the ground voltage at operating point 332, while at the data high operating point 324 the output of the gain circuit 250 is at the supply voltage, at operating point 334.

As a result, the first single-ended output voltage, d_out1 249, is amplified from a small voltage difference by the gain circuit 250 to the larger second single-ended output voltage d_out2 259 that ranges from a ground voltage to a supply voltage. In addition, it can be seen from the transfer curve 302 of the gain circuit 250 that a small deviation from the operating point 326 results in a large amplification of the second single-ended output voltage d_out2 259, resulting in the second single-ended output voltage 259 being driven quickly to the rail in both directions based on a small incremental change in the operating point of the data current sensing circuit 240. Thus, the sensing circuit 200 of FIG. 2 provides high-speed sensing for resistive memory devices.

Figure 4:
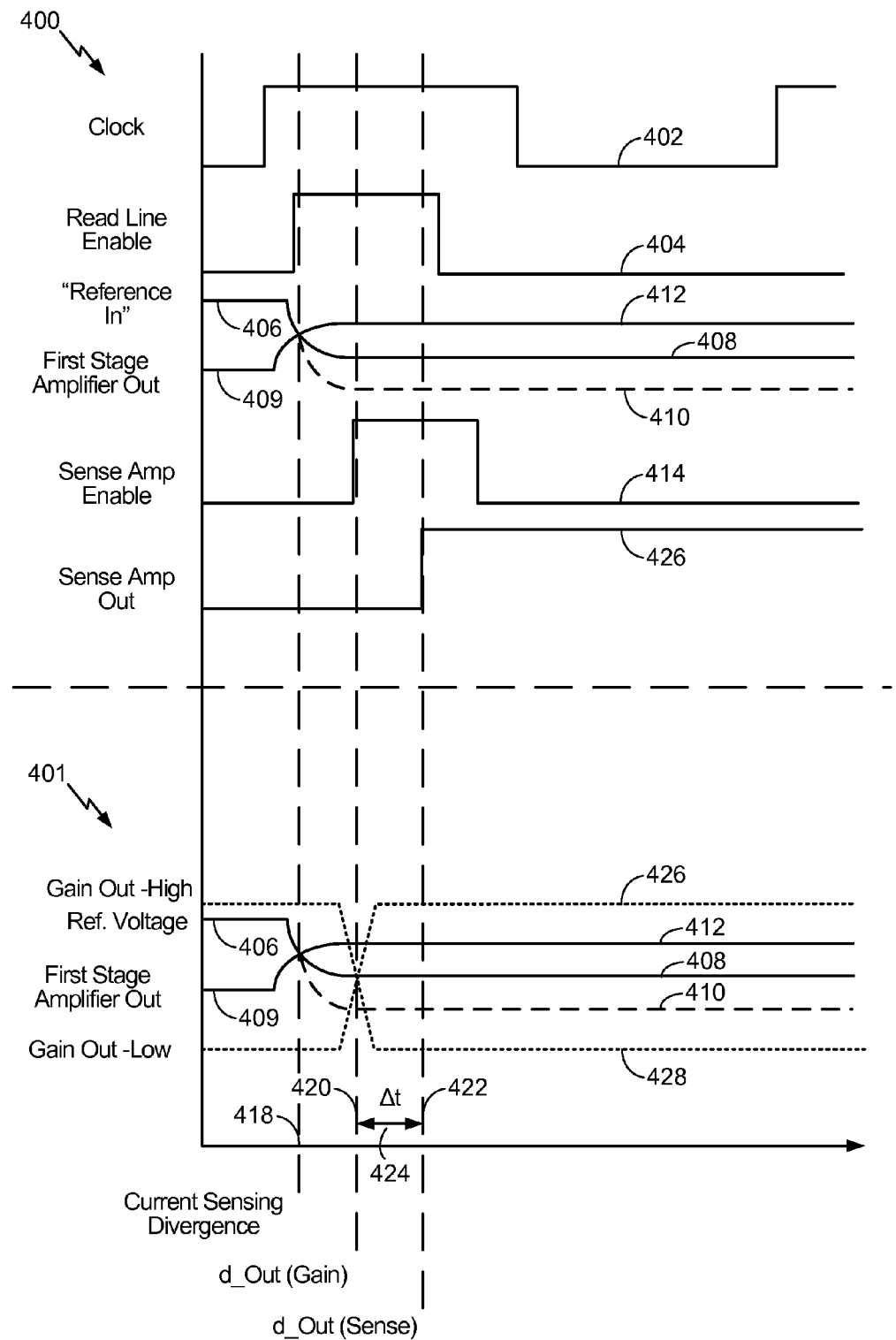
FIG. 4 is a timing diagram showing timing of a differential amplification circuit and timing of a single-ended amplification system of FIGS. 1 and 2.

Referring to FIG. 4, a particular illustrative embodiment of a timing diagram comparing timing signals of a differential amplification circuit to timing signals of a single-ended amplification circuit is depicted. A first set of signals 400 depicts timing signals for a differential amplification circuit and a second set of signals 401 depicts timing signals for a non-differential amplification system, such as the second amplifier stage 130 of FIG. 1 or the gain circuit 250 of FIG. 2. For both sets of signals 400 and 401, a clock signal 402 is illustrated as a periodic timing signal. A read line enable signal 404 is illustrated as transitioning from a low value to a high value after the clock signal 402 has transitioned from low to high (i.e., transitioned from a voltage corresponding to a logical low value to a voltage corresponding to a logical high value). A reference voltage 406 is illustrated as beginning at a high voltage level and, after the read line enable signal 404 transitions to high, falling to a steady stable voltage level 408 that is indicative of an average current flow through the data zero reference element 226 and the data one reference element 216 of the reference current sensing circuit 202.

A first stage amplifier output 409, such as the first single-ended output voltage 120 of FIG. 1 or the first single-ended output voltage d_out1 249 of FIG. 2, is illustrated as at an initial voltage, beginning a transition to a higher voltage in response to the transition from low to high of the clock 402, and in response to the read line enable signal 404 transition to high. The first stage amplifier output 409 either is driven to a low logic level 410 in response to a memory cell having a logic low value or the first stage amplifier output 409 is driven to a high logic level 412 in response to the data cell having a logic high value. It should be noted that the logic high and logic low voltage levels corresponding to the traces 410 and 412 should not be interpreted as a system ground and system high supply voltage level, and instead the voltage difference between traces 410 and 412 may be a narrow voltage differential corresponding to currents through a MTJ at two different data states of the MTJ. The first stage amplifier output 409 begins to measurably diverge at a current sensing divergence time 418.

In the first set of signals 400 depicting a differential amplification system, a sense amplifier enable signal 414 would transition from low to high to enable differential amplification of the reference signal 408 as compared to the first stage amplifier output, either for the high data value 410 or for the low data value 412. The sense amplifier enable signal 414 transitions from low to high at time 420. At a time after the sense amplifier enable 414 transitions to a high value, a sense amplifier output 416 is generated and illustrated as transitioning from a low value to a high value, at a time 422. As a result, the sense amplifier enable 414 does not transition to the high value at the time 420 until after a differential between the first stage amplifier output 409 and the reference voltage 408 is formed so that the comparison of the reference voltage 408 to the first stage amplifier output 409 does not generate a spurious signal that would result in an erroneous value of the output 416 of the sense amplifier.

In contrast, in the second set of signals 401 depicting a non-differential amplification system, the reference voltage 406 and the first stage amplifier output 409 are illustrated juxtaposed, with a gain out-low voltage 428 and a gain out high voltage 426 corresponding to the second single-ended output voltage 140 of the second amplifier stage 130 of FIG. 1 or the second single-ended output voltage 259 of the gain circuit 250 of FIG. 2. As illustrated, at the time 420 when the differential develops between the first stage amplifier output 409 and the reference voltage 406, the output of the second amplifier stage 130 is amplified to approach the high level 426 or the low level 428 without the delay associated with a differential sense amplifier, illustrated by the time Δt 424 between the transition of the sense amplifier enable 414 and the transition of the sense amplifier output 416 at time 422. Thus, the data output d_Out (Gain) at the time 420 occurs at an earlier stage during the gain operation than an output d_Out (Sense) of a differential application scheme.

Figure 5:
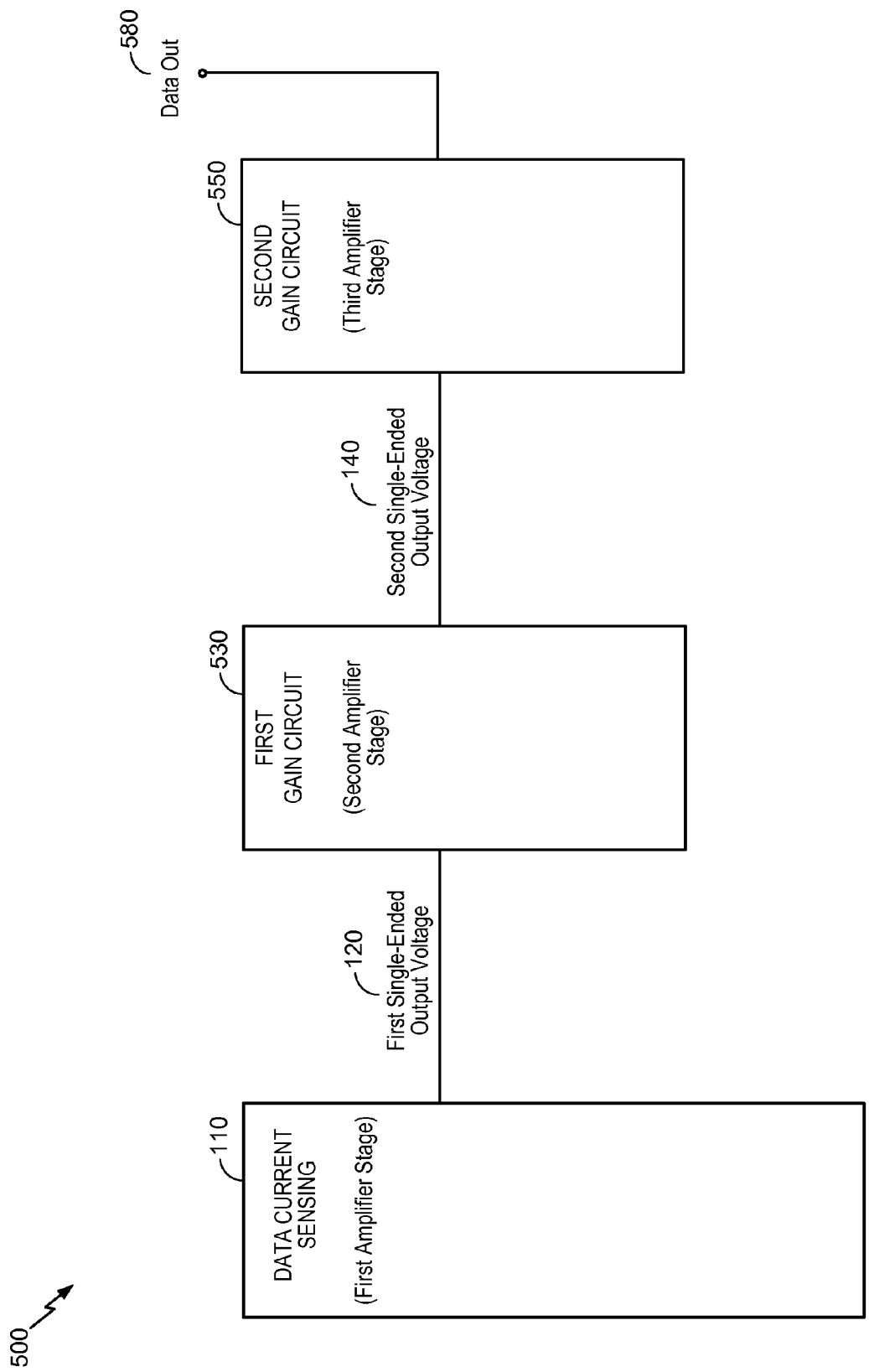
FIG. 5 is a block diagram of a particular illustrative embodiment of a system having gain circuits to generate an output voltage in response to a current passed through a resistive memory element.

FIG. 5 is a block diagram of another particular illustrative embodiment of a sensing circuit depicted and generally designated 500 using cascaded gain circuits to generate an output voltage in response to a current passed through a resistive memory element. The sensing circuit 500 includes a first amplifier stage or data current sensing circuit 110 coupled to a first gain circuit or second amplifier stage 530. As described with reference to FIG. 1, the first amplifier stage 110 is configured to convert a first current through a first resistive memory element of a memory cell (not shown in FIG. 5) into a first single-ended output voltage 120. The second amplifier stage 530 is configured to amplify the first single-ended output voltage 120 of the first amplifier stage 110 to produce a second single-ended output voltage 140. A second gain circuit or third amplifier stage 550 may be configured to receive and to amplify the second single-ended output voltage 140. When the second single-ended output voltage 140 is not latched (such as by the latch 274 of as in FIG. 2), cascading additional amplifier stages, such as the third amplifier stage 550, may be used to further increase speed in reading a data value by further amplifying divergence of single-ended output signals from a reference voltage. For example, further amplifying the first single-ended output voltage 120 further amplifies the difference between the first single-ended output voltage 120 and a reference voltage, thereby increasing the speed of detection of the data signal. Additional amplification stages may be cascaded to further amplify the single-ended output voltage.

Figure 6:
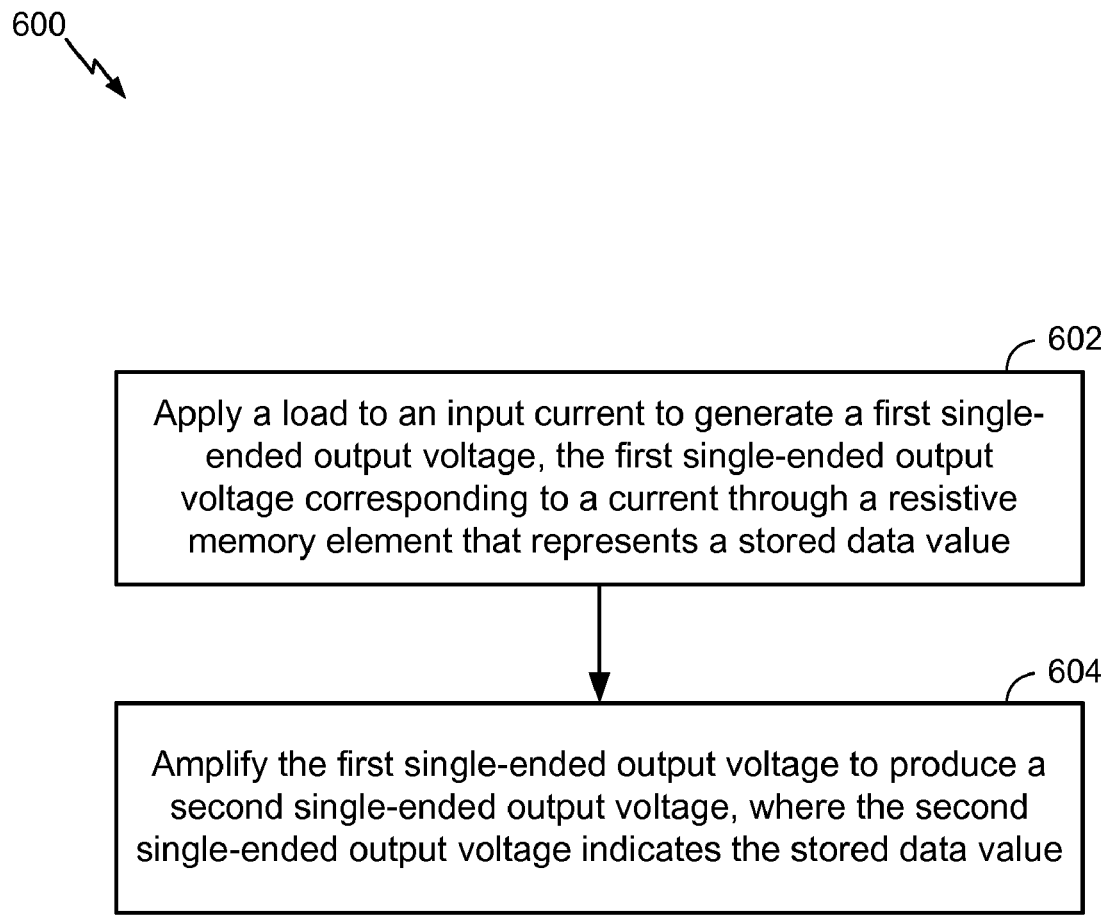
FIG. 6 is a flow diagram of a particular illustrative embodiment of a method of amplifying a first single-ended output voltage to generate a second open-ended output voltage to determine a stored data value from a resistive memory element.

FIG. 6 is a flow diagram of a particular illustrative embodiment of a method 600 of amplifying a first single-ended output voltage to generate a second single-ended output voltage. The method 600 may be performed using the sensing circuit 100 of FIG. 1, the sensing circuit 200 of FIG. 2, the sensing circuit 500 of FIG. 5, by one or more other systems, or any combination thereof.

A load may be applied to a current to generate a first single-ended output voltage, at 602. For example, a p-channel metal oxide semiconductor (PMOS) load device for the current, such as the PMOS load device 242 of FIG. 2, may be biased based on an average current of a reference resistance pair, such as the reference pair 208. A first resistive element in the reference resistance pair, such as the resistive element 226 of FIG. 2, may be configured to represent a low logical data value and a second resistive element in the reference resistance pair, such as the resistive element 216, may be configured to represent a high logical data value.

The first single-ended output voltage, such as the first single-ended output voltage 120 of FIG. 1, corresponds to an current through a resistive memory element that represents a stored data value, such as the current 116 through the resistive memory element 114. The resistive memory element may represent the stored data value in a cell of a magneto-resistive random access memory (MRAM) or of a spin transfer torque MRAM (STT-MRAM).

The first single-ended output voltage is amplified to produce a second single-ended output voltage, at 604. For example, the first single-ended output voltage 120 of FIG. 1 is amplified by the second amplifier stage 130 to produce the second single-ended output voltage 140. The second single-ended output voltage indicates the stored data value. Amplifying the first single-ended output voltage may include amplifying the first single-ended output voltage to produce a ground voltage or a supply voltage based on the stored data value. The second single-ended output voltage may be presented at a first voltage level substantially equal to the ground voltage in response to the resistive memory element having a first resistance. The second single-ended output voltage may be presented at a second voltage level substantially equal to the supply voltage in response to the resistive memory element having a second resistance.

Amplifying the first single-ended output voltage may be performed at an amplifier stage that comprises an n-channel metal oxide semiconductor (NMOS) transistor having a gate responsive to the first single-ended output voltage. For example, the first NMOS transistor 260 of FIG. 2 has a gate responsive to the first single-ended output voltage d_out1 249. The second single-ended output voltage may be read at a drain of the NMOS transistor when a read line is enabled. For example, the second single-ended output voltage d_out2 259 of FIG. 2 may be read at a drain of the first NMOS transistor 260 when the read line 227 is enabled. An initial change of the current may initiate an immediate change from an equilibrium point of the second single-ended output voltage, such as described with respect to the equilibrium point 336 of FIG. 3.

The second single-ended output voltage may be latched. For example, the second single-ended output voltage d_out2 259 of FIG. 2 may be latched at the latch 270. The second single-ended output voltage may be amplified. To illustrate, the second single-ended output voltage 140 may be amplified by one or more additional gain circuits, such as the second gain circuit 550 of FIG. 5.

Figure 7:
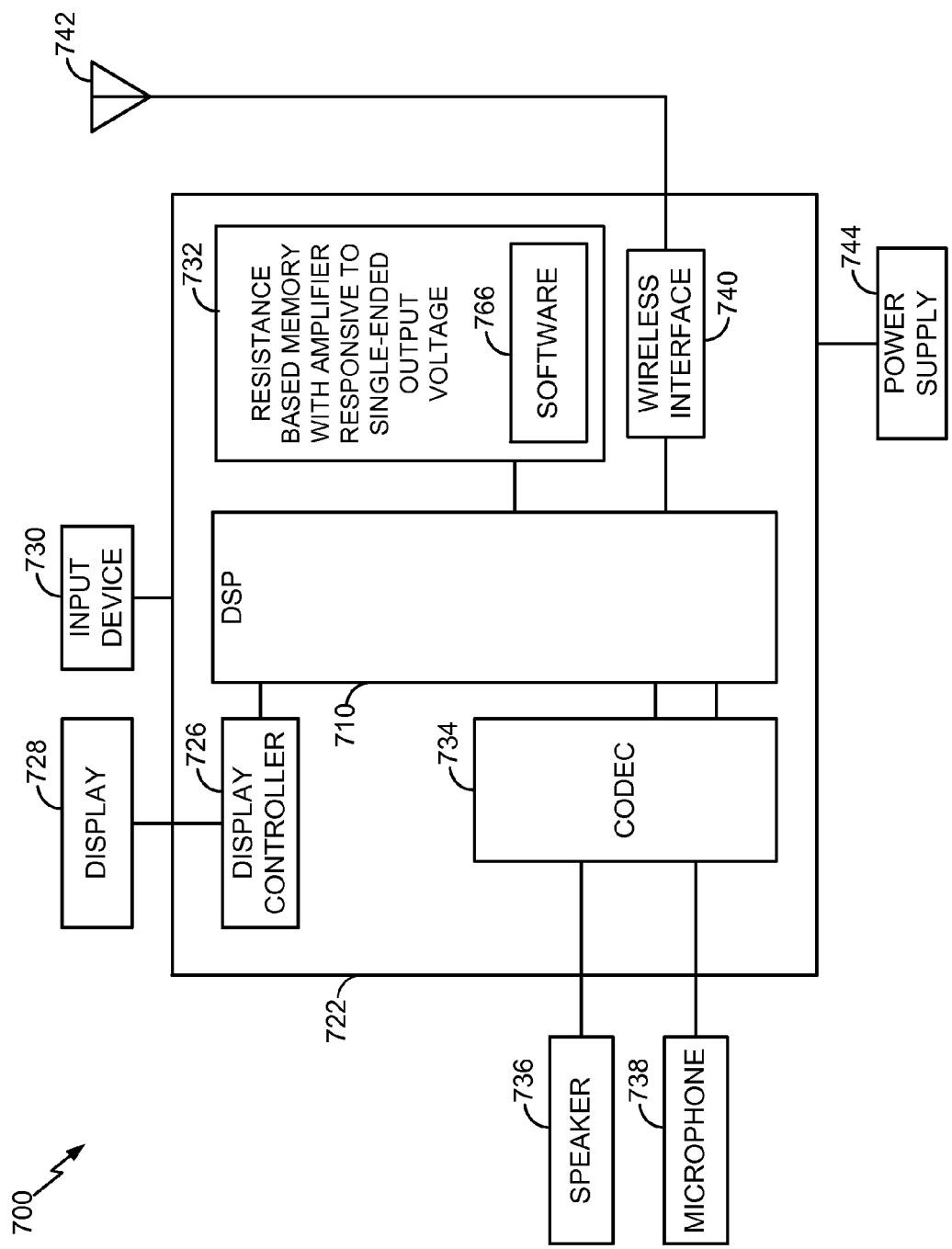
FIG. 7 is a block diagram of a particular embodiment of a wireless communication device including a resistance-based memory with an amplifier responsive to a single-ended output voltage.

A memory sensing circuit that is configured to perform the amplification of the first single-ended output voltage may be integrated into an electronic device 700, as described with reference to FIG. 7. FIG. 7 is a block diagram of a particular embodiment of a wireless communication device 700 including a resistance-based memory with an amplifier responsive to a single-ended output voltage. The system 700 may be implemented in a portable electronic device and includes a processor 710, such as a digital signal processor (DSP), coupled to computer readable medium, such as a memory 732, storing computer readable instructions, such as software 766. The memory 732 is a resistance-based memory and includes an amplifier responsive to a single-ended output voltage. In an illustrative example, the memory 732 includes one or more cascaded gain circuits, such as the second amplifier stage 130 of FIG. 1, the gain circuit 250 of FIG. 2, or the first gain circuit (second amplifier stage) 530 and second gain circuit (third amplifier stage) 550 of FIG. 5, that are responsive to a first single-ended output voltage, such as the first single-ended output voltage 120 of FIGS. 1 and 5 and d_out1 249 of FIG. 2.

A display controller 726 is coupled to the processor 710 and to a display device 728. A coder/decoder (CODEC) 734 can also be coupled to the processor 710. A speaker 736 and a microphone 738 can be coupled to the CODEC 734. A wireless interface 740 can be coupled to the processor 710 and to a wireless antenna 742.

In a particular embodiment, the processor 710, the display controller 726, the memory 732, the CODEC 734, and the wireless interface 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display device 728, the input device 730, the speaker 736, the microphone 738, the wireless antenna 742, and the power supply 744 are external to the system-on-chip device 722. However, each of the display device 728, the input device 730, the speaker 736, the microphone 738, the wireless antenna 742, and the power supply 744 can be coupled to a component of the system-on-chip device 722, such as an interface or a controller.

Figure 8:
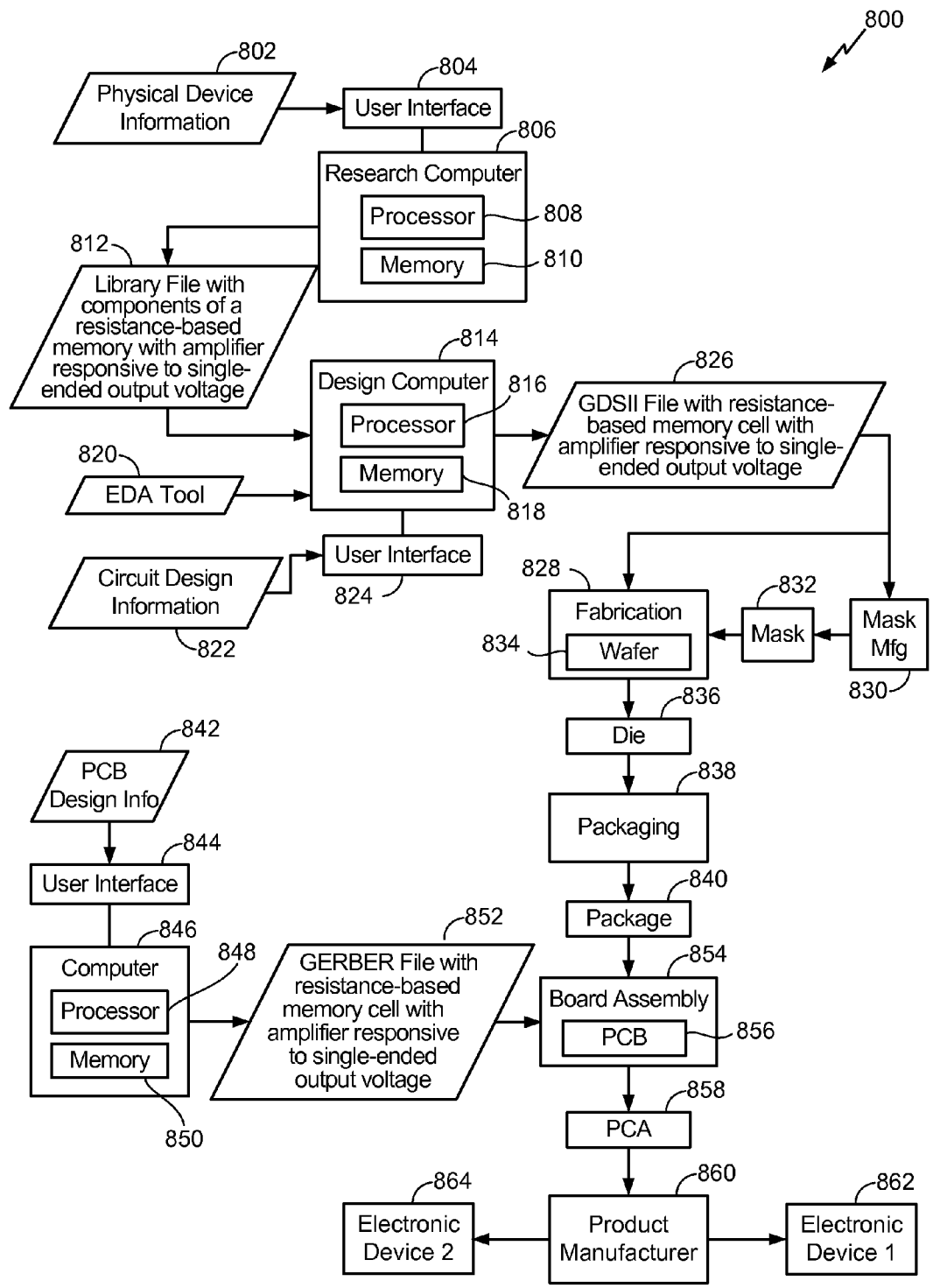
FIG. 8 is a data flow diagram illustrating a manufacturing process for use with a device having a resistance-based memory and an amplifier responsive to a single-ended output voltage.

The foregoing disclosed devices and functionalities (such as the devices of FIG. 1, 2, 5, or 7, the method of FIG. 6, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 8 depicts a particular illustrative embodiment of an electronic device manufacturing process 800.

Physical device information 802 is received in the manufacturing process 800, such as at a research computer 806. The physical device information 802 may include design information representing at least one physical property of a semiconductor device, such as the systems of FIG. 1, 2, 5, or 7, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including the sensing circuit 100 of FIG. 1, the sensing circuit 200 of FIG. 2, the sensing circuit 500 of FIG. 5, the device 722 of FIG. 7, or any combination thereof, that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit using the sensing circuit 100 of FIG. 1, the sensing circuit 200 of FIG. 2, the sensing circuit 500 of FIG. 5, the device 722 of FIG. 7, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as the sensing circuit 100 of FIG. 1, the sensing circuit 200 of FIG. 2, the sensing circuit 500 of FIG. 5, the device 722 of FIG. 7, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file format may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the sensing circuit 100 of FIG. 1, the sensing circuit 200 of FIG. 2, the sensing circuit 500 of FIG. 5, the device 722 of FIG. 7, or any combination thereof, in addition to other circuits or information. To illustrate, the data file may include information corresponding to a system-on-chip (SOC) that includes the sensing circuit 100 of FIG. 1, the sensing circuit 200 of FIG. 2, the sensing circuit 500 of FIG. 5, the device 722 of FIG. 7, or any combination thereof, and that also includes additional electronic circuits and components within the SOC.

The GDSII file 826 may be received at a fabrication process 828 to manufacture the sensing circuit 100 of FIG. 1, the sensing circuit 200 of FIG. 2, the sensing circuit 500 of FIG. 5, the device 722 of FIG. 7, or any combination thereof, according to transformed information in the GDSII file 826. For example, a device manufacture process may include providing the GDSII file 826 to a mask manufacturer 830 to create one or more masks, such as masks to be used for photolithography processing, illustrated as a representative mask 832. The mask 832 may be used during the fabrication process to generate one or more wafers 834, which may be tested and separated into dies, such as a representative die 836. The die 836 includes a circuit including the sensing circuit 100 of FIG. 1, the sensing circuit 200 of FIG. 2, the sensing circuit 500 of FIG. 5, the device 722 of FIG. 7, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the sensing circuit 100 of FIG. 1, the sensing circuit 200 of FIG. 2, the sensing circuit 500 of FIG. 5, the device 722 of FIG. 7, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the sensing circuit 100 of FIG. 1, the sensing circuit 200 of FIG. 2, the sensing circuit 500 of FIG. 5, the device 722 of FIG. 7, or any combination thereof, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines for performing various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIGS. 7-8 may illustrate remote units according to teachings of the disclosure, the disclosure is not limited to these exemplary illustrated units. Embodiments of the disclosure may be suitably employed in any device which includes active integrated circuitry including memory and on-chip circuitry.

Thus, the sensing circuit 100 of FIG. 1, the sensing circuit 200 of FIG. 2, the sensing circuit 500 of FIG. 5, the device 722 of FIG. 7, or any combination thereof, may be fabricated, processed, and incorporated into an electronic device, as described in the illustrative process 800. One or more aspects of the embodiments disclosed with respect to the sensing circuit 100 of FIG. 1, the sensing circuit 200 of FIG. 2, the sensing circuit 500 of FIG. 5, the device 722 of FIG. 7, or any combination thereof, may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity, or by one or more entities performing various stages of the process 800.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions that are executable by a processing device depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    a sensing circuit comprising:
        a first amplifier stage configured to convert a first current through a first resistive memory element of a memory cell into a first single-ended output voltage; and
        a second amplifier stage configured to amplify the first single-ended output voltage of the first amplifier stage to produce a second single-ended output voltage,
    wherein the second amplifier stage comprises a transistor responsive to a reference voltage.

2. The apparatus of claim 1, wherein the first resistive memory element represents a data value stored in the memory cell and the second single-ended output voltage indicates the data value of the first resistive memory element.

3. The apparatus of claim 2, wherein the first resistive memory element represents the data value stored in a magneto-resistive random access memory (MRAM) cell or a spin transfer torque MRAM (STT-MRAM) cell.

4. An apparatus comprising:
    a sensing circuit comprising:
        a first amplifier stage configured to convert a first current through a first resistive memory element of a memory cell into a first single-ended output voltage; and
        a second amplifier stage configured to amplify the first single-ended output voltage of the first amplifier stage to produce a second single-ended output voltage,
    wherein the second amplifier stage has an equilibrium point approximately halfway between a high voltage level of the second single-ended output voltage and a low voltage level of the second single-ended output voltage.

5. The apparatus of claim 4, wherein:
    a data low operating point of the second single-ended output voltage is at a ground voltage supplied to the second amplifier stage when a first value of the first single-ended output voltage corresponds to a first data value stored at the first resistive memory element; and
    a data high operating point of the second single-ended output voltage is at a supply voltage supplied to the second amplifier stage when a second value of the first single-ended output voltage corresponds to a second data value stored at the first resistive memory element.

6. The apparatus of claim 4, further comprising a third amplifier stage configured to receive the second single-ended output voltage and to generate a third single-ended output voltage, wherein:
    a data low operating point of the third single-ended output voltage is at a ground voltage supplied to the third amplifier stage when a first value of the first single-ended output voltage corresponds to a first data value stored at the first resistive memory element; and
    a data high operating point of the third single-ended output voltage is at a supply voltage supplied to the third amplifier stage when a second value of the first single-ended output voltage corresponds to a second data value stored at the first resistive memory element.

7. The apparatus of claim 6, wherein each of the second amplifier stage and the third amplifier stage generates an output at an interval of not substantially more than one gate delay.

8. The apparatus of claim 1, wherein the second amplifier stage is not configured to perform differential amplification.

9. An apparatus comprising:
    a sensing circuit comprising:
        a first amplifier stage configured to convert a first current through a first resistive memory element of a memory cell into a first single-ended output voltage; and
        a second amplifier stage configured to amplify the first single-ended output voltage of the first amplifier stage to produce a second single-ended output voltage,
    wherein a change in the first current initiates an immediate change from an equilibrium point of the second single-ended output voltage.

10. The apparatus of claim 9, wherein:
    a first value of the first single-ended output voltage corresponds to a first data value stored at the first resistive memory element;
    a second value of the first single-ended output voltage corresponds to a second data value stored at the first resistive memory element; and
    the change in the first current initiating the immediate change from the equilibrium point enables operation of the second amplifier stage when the differential is less than a differential amplification voltage offset that increases with process scaling.

11. The apparatus of claim 1, wherein the second amplifier stage further comprises a gain device coupled between a voltage supply and a ground.

12. The apparatus of claim 11, wherein the gain device comprises a first re-channel metal oxide semiconductor (NMOS) transistor comprising a gate responsive to the first single-ended output voltage.

13. The apparatus of claim 12, wherein the second single-ended output voltage is a voltage read at a drain of the first NMOS transistor when a read line is enabled.

14. The apparatus of claim 13, wherein the transistor is a p-channel metal oxide semiconductor (PMOS) transistor comprising a gate responsive to the reference voltage, a drain coupled to the voltage supply and a source coupled to the drain of the first NMOS transistor, and wherein the gain device further comprises a second NMOS transistor comprising a gate responsive to the read line, a drain coupled to a source of the first NMOS transistor, and a source coupled to the ground.

15. The apparatus of claim 12, wherein in response to the first resistive memory element having a first resistance, the second single-ended output voltage is substantially equal to a ground voltage, and wherein in response to the first resistive memory element having a second resistance, the second single-ended output voltage is substantially equal to a supply voltage.

16. The apparatus of claim 12, wherein the gate of the first NMOS transistor is directly coupled to a first resistive load and wherein an initial voltage of the first single-ended output voltage corresponding to an initial value of the first current is amplified by the second amplifier stage.

17. An apparatus comprising:
a sensing circuit comprising:
a first amplifier stage configured to convert a first current through a first resistive memory element of a memory cell into a first single-ended output voltage; and
a second amplifier stage configured to amplify the first single-ended output voltage of the first amplifier stage to produce a second single-ended output voltage,
wherein an operating current of the first amplifier stage is an average current of a reference resistance pair, wherein a first resistive element in the reference resistance pair is configured to represent a low logical data value and a second resistive element in the reference resistance pair is configured to represent a high logical data value.

18. The apparatus of claim 1, further comprising a latch to store the second single-ended output voltage.

19. The apparatus of claim 1, wherein the sensing circuit is integrated in at least one semiconductor die.

20. The apparatus of claim 19, further comprising a device selected from the group consisting of a set top box, a music player, a video player, an entertainment unit, a navigation device, a communications device, a personal digital assistant (PDA), a fixed location data unit, and a computer, into which the sensing circuit is integrated.

21. A sensing circuit comprising:
first amplifier means for generating a first single-ended output voltage based on a first current passing through a resistive memory cell; and
second amplifier means for amplifying the first single-ended output voltage to produce a second single-ended output voltage, wherein the second single-ended output voltage represents a data output of the resistive memory cell,
wherein the second amplifier means comprises a transistor responsive to a reference voltage.

22. The sensing circuit of claim 21, wherein the resistive memory cell includes a magneto-resistive random access memory (MRAM) cell and wherein the first current represents a data value stored in the MRAM cell.

23. The sensing circuit of claim 21, wherein the second amplifier means for amplifying the first single-ended output voltage comprises a gain means coupled between a voltage supply and a ground.

24. The sensing circuit of claim 23, wherein the gain means includes an n-channel metal oxide semiconductor (NMOS) transistor having a gate responsive to the first single-ended output voltage.

25. The sensing circuit of claim 24, wherein the second single-ended output voltage is a voltage read at a drain of the NMOS transistor when a read line is enabled.

26. The sensing circuit of claim 23, wherein in response to the first current passing through the resistive memory cell having a first value, the second single-ended output voltage is substantially equal to the ground voltage, and wherein in response to the first current passing through the resistive memory cell having a second value, the second single-ended output voltage is substantially equal to the supply voltage.

27. The sensing circuit of claim 21, further comprising means to store the second single-ended output voltage.

28. The sensing circuit of claim 21, further comprising means for amplifying the second single-ended output voltage.

29. A method comprising:
amplifying a first single-ended output voltage corresponding to a current through a resistive memory element that represents a stored data value to produce a second single-ended output voltage, wherein the second single-ended output voltage indicates the stored data value; and
biasing a p-channel metal oxide semiconductor (PMOS) load device for the current based on an average current of a reference resistance pair, wherein a first resistive element in the reference resistance pair is configured to represent a low logical data value and a second resistive element in the reference resistance pair is configured to represent a high logical data value.

30. The method of claim 29, wherein an initial change of the current initiates an immediate change from an equilibrium point of the second single-ended output voltage.

31. The method of claim 29, wherein amplifying the first single-ended output voltage comprises amplifying the first single-ended output voltage to a ground voltage or to a supply voltage based on the stored data value.

32. The method of claim 31, wherein amplifying the first single-ended output voltage is performed at an amplifier stage that comprises an n-channel metal oxide semiconductor (NMOS) transistor having a gate responsive to the first single-ended output voltage.

33. The method of claim 32, further comprising reading the second single-ended output voltage at a drain of the NMOS transistor when a read line is enabled.

34. The method of claim 33, further comprising presenting the second single-ended output voltage at a first voltage level substantially equal to the ground voltage in response to the resistive memory element having a first resistance, and presenting the second single-ended output voltage at a second voltage level substantially equal to the supply voltage in response to the resistive memory element having a second resistance.

35. The method of claim 29, wherein the resistive memory element represents the stored data value in a cell of a magneto-resistive random access memory (MRAM) or of a spin transfer torque MRAM (STT-MRAM).

36. The method of claim 29, further comprising latching the second single-ended output voltage.

37. The method of claim 29, further comprising amplifying the second single-ended output voltage.

38. The method of claim 37, wherein the amplifying is performed at a memory sensing circuit integrated into an electronic device.

39. A method comprising:
a first step for applying a first resistive load to a current to generate a first single-ended output voltage, wherein the first single-ended output voltage represents a stored data value at a resistive memory element; and
a second step for amplifying the first single-ended output voltage to produce a second single-ended output voltage, wherein the second single-ended output voltage indicates the stored data value, and wherein the second single-ended output voltage is produced at least in part based on a reference voltage.

40. The method of claim 39, wherein the first step and the second step are performed at an amplifier circuit integrated into an electronic device.

41. A method comprising:
receiving a data file including design information corresponding to a semiconductor device; and
fabricating the semiconductor device according to the design information, wherein the semiconductor device comprises:
a data cell including a resistance-based memory element;
a first amplifier stage coupled to the data cell, wherein the first amplifier stage converts an current through the resistance-based memory element into a first single-ended output voltage; and
a second amplifier stage that amplifies the first single-ended voltage of the first amplifier stage to produce a second single-ended output voltage.

42. The method of claim 41, wherein the data file has a GDSII format.

43. The method of claim 41, wherein the data file includes a GERBER format.

* * * * *